United States Patent
Shin et al.

(10) Patent No.: US 10,146,680 B2
(45) Date of Patent: Dec. 4, 2018

(54) DATA PROCESSING SYSTEM AND METHOD OF OPERATING THE SAME

(71) Applicants: Ho Seok Shin, Hwaseong-si (KR); Na Kyoung Yoo, Anyang-si (KR); Gun Seo Koo, Osan-si (KR); Jae Hun Kim, Hwaseong-si (KR); Woo Hyuk Jang, Hwaseong-si (KR)

(72) Inventors: Ho Seok Shin, Hwaseong-si (KR); Na Kyoung Yoo, Anyang-si (KR); Gun Seo Koo, Osan-si (KR); Jae Hun Kim, Hwaseong-si (KR); Woo Hyuk Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 14/205,992

(22) Filed: Mar. 12, 2014

(65) Prior Publication Data

US 2014/0281344 A1    Sep. 18, 2014

(30) Foreign Application Priority Data

Mar. 12, 2013  (KR) .................. 10-2013-0026326

(51) Int. Cl.
*G06F 13/00* (2006.01)
*H03M 7/00* (2006.01)
(Continued)

(52) U.S. Cl.
CPC ............. *G06F 12/02* (2013.01); *H03M 7/30* (2013.01); *G06F 12/023* (2013.01); *G06F 2212/401* (2013.01)

(58) Field of Classification Search
CPC ............... G06F 8/4443; G06F 17/2252; G06F 17/30153

(Continued)

(56) References Cited

U.S. PATENT DOCUMENTS 6,157,743 A * 12/2000 Goris .................. G06T 1/60
                                                        345/501
7,188,227 B2    3/2007 Luick
(Continued)

FOREIGN PATENT DOCUMENTS

CN     1127558 A    7/1996
CN     1672135 A    9/2005
(Continued)

OTHER PUBLICATIONS

Search Report dated Dec. 4, 2014 for corresponding Dutch Application No. 2012396.
(Continued)

*Primary Examiner* — Farley Abad
*Assistant Examiner* — Getente A Yimer
(74) *Attorney, Agent, or Firm* — Harness, Dickey & Pierce, P.L.C.

(57) ABSTRACT

A method of operating a data processing system includes compressing a first part of uncompressed data, and determining whether to compress a second part of the uncompressed data based on an expected data size of the compressed first part and an actual data size of the compressed first part. The method further includes transmitting one of first transmission data and second transmission data to an external memory device based on a result of the determining. The first transmission data includes the compressed first and second parts, and the second transmission data includes the first and second parts of the uncompressed data.

22 Claims, 12 Drawing Sheets

(51) Int. Cl.
*G06F 12/02* (2006.01)
*H03M 7/30* (2006.01)

(58) Field of Classification Search
USPC ............................... 710/62, 68, 72, 74, 100
See application file for complete search history.

(56) References Cited

U.S. PATENT DOCUMENTS

| | | | | |
|---|---|---|---|---|
| 7,447,814 | B1* | 11/2008 | Ekman | G06F 12/08 |
| | | | | 710/68 |
| 7,660,962 | B2 | 2/2010 | Tseytin | |
| 7,688,233 | B2 | 3/2010 | Schneider | |
| 8,037,255 | B2 | 10/2011 | Jeong et al. | |
| 8,040,537 | B2 | 10/2011 | Smith | |
| 9,077,368 | B2* | 7/2015 | Miller | H03M 7/30 |
| 2005/0055483 | A1* | 3/2005 | Devlin | G11B 27/034 |
| | | | | 710/68 |
| 2006/0069879 | A1* | 3/2006 | Inoue | G06F 13/28 |
| | | | | 711/147 |
| 2008/0225327 | A1* | 9/2008 | Smith | H04N 1/00238 |
| | | | | 358/1.15 |
| 2008/0294820 | A1* | 11/2008 | Croxford | G06F 13/4013 |
| | | | | 710/105 |
| 2009/0201180 | A1 | 8/2009 | Schneider | |
| 2009/0248912 | A1* | 10/2009 | Taguchi | G06F 12/0246 |
| | | | | 710/30 |
| 2009/0259789 | A1* | 10/2009 | Kato | G06F 13/28 |
| | | | | 710/308 |
| 2010/0030797 | A1 | 2/2010 | Johnson et al. | |
| 2010/0092097 | A1 | 4/2010 | Fukuhara et al. | |
| 2010/0185795 | A1* | 7/2010 | Chen | H04N 7/15 |
| | | | | 710/51 |
| 2013/0060992 | A1 | 3/2013 | Cho et al. | |

FOREIGN PATENT DOCUMENTS

| | | |
|---|---|---|
| CN | 101000605 A | 7/2007 |
| CN | 102708187 A | 10/2012 |
| CN | 102843341 A | 12/2012 |
| JP | 2007066142 A | 3/2007 |
| JP | 2008152339 A | 7/2008 |
| JP | 2008225818 A | 9/2008 |
| JP | 2008226082 A | 9/2008 |
| JP | 2009055141 A | 3/2009 |
| WO | WO-92/17844 A1 | 10/1992 |

OTHER PUBLICATIONS

Chinese Office Action dated Feb. 27, 2018 in related Chinese Application No. 201410090133.2.

* cited by examiner

DATA PROCESSING SYSTEM AND METHOD OF OPERATING THE SAME

CROSS-REFERENCE TO RELATED APPLICATIONS

This application claims priority under 35 U.S.C. § 119(a) from Korean Patent Application No. 10-2013-0026326 filed on Mar. 12, 2013, the disclosure of which is hereby incorporated by reference in its entirety.

BACKGROUND

With the increase of computing power in a mobile device, such as a smart phone and a tablet personal computer (PC), a plurality of applications are able to operate in the mobile device at one time.

When multiple applications are running at a same time, the capacity of a system memory of the mobile device decreases, and multi-tasking issues may arise.

To overcome these issues, a data swap operation may be used. In a data swap operation, data stored in the system memory that is used in an application but does not operate on front-ground is moved to an external memory device. During the data swap operation, all of the data to be moved may be compressed in order to increase the transmission speed of the data moved to the external memory device and the lifespan of the external memory device.

SUMMARY

At least one embodiment of the inventive concepts relates to a data processing technique, and more particularly, to a method of selectively compressing part of uncompressed data, which will be swapped, based on a compression ratio for the rest of the uncompressed data and/or a device for performing the method.

According to at least one example embodiment, a method of operating a data processing system includes compressing a first part of uncompressed data, and determining whether to compress a second part of the uncompressed data based on an expected data size of the compressed first part and an actual data size of the compressed first part. The method includes transmitting one of first transmission data and second transmission data to an external memory device based on a result of the determining. The first transmission data includes the compressed first and second parts, and the second transmission data includes the first and second parts of the uncompressed data.

According to at least one example embodiment, the compressing includes compressing the first part of the uncompressed data using a first compression algorithm from among at least one compression algorithm. The determining includes comparing the expected data size of the compressed first part with the actual data size of the compressed first part, and determining whether to compress the second part based on a result of the comparing.

According to at least one example embodiment, the method further includes calculating the expected data size based on a minimum compression ratio, a compression ratio of the first compression algorithm, and a reference data block size.

According to at least one example embodiment, the minimum compression ratio and the reference data block size are set by one of a manufacturer and a user.

According to at least one example embodiment, the minimum compression ratio is a ratio of a minimum desired data size of the compressed first part to a data size of the first part of the uncompressed data.

According to at least one example embodiment, the method further includes calculating an expected compression ratio of the first part based on a minimum compression ratio and a ratio of a compression ratio of the first compression algorithm to an overall compression ratio of the at least one compression algorithm. The method further includes calculating the expected data size based on the expected compression ratio and a reference data block size.

According to at least one example embodiment, the comparing the expected data size with the compressed data size includes generating a count value by counting a data size of first part of the uncompressed data, and comparing the expected data size with the actual data size if a reference data block size is equal to the count value.

According to at least one example embodiment, the first part of the uncompressed data includes a first data block from among a plurality of data blocks that are included in the uncompressed data.

According to at least one example embodiment, a data processing system includes an internal memory device configured to store uncompressed data, and a processor. The processor is configured to compress a first part of the uncompressed data, determine whether to compress a second part of the uncompressed data based on an expected data size of the compressed first part and an actual data size of the compressed first part, and control a direct memory access (DMA) controller to transmit one of first transmission data and second transmission data from the internal memory device to an external memory device based on a result of the determination. The first transmission data includes the compressed first and second parts. The second transmission data includes the first and second parts of the uncompressed data.

According to at least one example embodiment, the processor is configured to compress the first part of the uncompressed data using a first compression algorithm from among at least one compression algorithm, compare the expected data size of the compressed first part with the actual data size of the compressed first part, and control the DMA controller based on a result of the comparison.

According to at least one example embodiment, the processor is configured to generate a count value by counting a data size of the first part of the uncompressed data, and compare the expected data size with the actual data size if a reference data block size is equal to the count value.

According to at least one example embodiment, a data processing system includes an internal memory device configured to store uncompressed data and a compression circuit. The compression circuit is configured to compress a first part of the uncompressed data, determine whether to compress a second part of the uncompressed data based on an expected data size of the compressed first part and an actual data size of the compressed first part, and output a determination signal based on the determination. The data processing system includes a central processing unit configured to generate a control signal based on the determination signal, and a direct memory access (DMA) controller configured to transmit one of first transmission data and second transmission data from the internal memory device to an external memory device based on the control signal. The first transmission data includes the compressed first and second parts, and the second transmission data includes the first and second parts of the uncompressed data.

According to at least one example embodiment, the compression circuit is configured to compress the first part of the uncompressed data using a first compression algorithm from among at least one compression algorithm, compare the expected data size of the compressed first part with the actual data size of the compressed first part, and output the determination signal based on a result of the comparison.

According to at least one example embodiment, the compression circuit is configured to generate a count value by counting a data size of the first part of the uncompressed data compare the expected data size with the actual data size if a reference data block size is equal to the count value, and generate the determination signal based on the result of the comparison.

According to at least one example embodiment, the compression circuit includes a compressor configured to compress the first part of the uncompressed data, an expected data size calculator configured to calculate the expected data size based on a minimum compression ratio and a reference data block size, and a compression determination circuit. The compression determination circuit is configured to compare the expected data size with the actual data size of the compressed first part output from the compressor, and output the determination signal based on a result of the comparison.

According to at least one example embodiment, the compression circuit further includes an enable control circuit configured to calculate a size of the first part of the uncompressed data, and generate an enable signal if the calculated size of the first part is equal to the reference data block size. The compression determination circuit is configured to compare the expected data size with the actual data size of the compressed first part in response to the enable signal, and output the determination signal based on the result of the comparison.

According to at least one example embodiment, the compressor is a first compressor from among a plurality of compressors connected in series to each other.

According to at least one example embodiment, the data processing system is a system on chip.

According to at least one example embodiment, the compression circuit includes a compressor configured to compress the first part of the uncompressed data, a first counter configured to count a data size of the first part of the uncompressed data and output a first count value, a second counter configured to count a data size of the compressed first part output from the compressor and output a second count value, an expected data size calculator configured to calculate the expected data size based on a minimum compression ratio, a reference data block size, and a compression ratio of the compressor, and a compression determination circuit. The compression determination circuit is configured to compare the expected data size with the second count value, and output the determination signal based on a result of the comparison.

According to at least one example embodiment, the compression circuit further includes an enable control circuit configured to generate an enable signal if the reference data block size is equal to the first count value. the compression determination circuit is configured to compare the expected data size with the second count value in response to the enable signal, and output the determination signal based on the result of the comparison.

According to at least one example embodiment, a mobile device includes a central processing unit configured to execute a mobile application, an internal memory device configured to store uncompressed data used in the mobile application, and a compression circuit. The compression circuit is configured to calculate an expected data size for a first part of the uncompressed data based on a minimum compression ratio, a compression ratio of at least one compression algorithm used for compression, and a reference data block size, and determine whether to compress a second part of the uncompressed data based on a result of the calculation. The mobile device includes a direct memory access (DMA) controller configured to transmit one of first transmission data and second transmission data from the internal memory device to an external memory device based on a result of the determination. The first transmission data includes the compressed first and second parts, and the second transmission data includes the first and second parts of the uncompressed data.

According to at least one example embodiment, the compression circuit is configured to compress the first part of the uncompressed data using a first compression algorithm from among the at least one compression algorithm, compare the expected data size with a compressed data size of the first part, and determine whether to compress the second part based on a result of the comparison.

According to at least one example embodiment, the compression circuit is configured to generate a count value for the first part of the uncompressed data, and compare the expected data size with the compressed data size if the reference data block size is equal to the count value.

According to at least one example embodiment, the compression circuit includes a compressor configured to compress the first part of the uncompressed data, a first counter configured to count a data size of the first part of the uncompressed data and output a first count value, a second counter configured to count a data size of the compressed first part output from the compressor and output a second count value, an expected data size calculator configured to calculate the expected data size, and a compression determination circuit. The compression determination circuit is configured to compare the expected data size with the second count value, and determine whether to compress the second part based on a result of the comparison.

According to at least one example embodiment, the compressor is a first compressor from among a plurality of compressors connected in series to each other.

According to at least one example embodiment, a data processing device is configured to compress a first uncompressed part of uncompressed data to produce first compressed data, determine, based on an expected data size of the first compressed part and an actual data size of the first compressed part, whether to compress a second uncompressed part of the uncompressed data to produce second compressed data, and transmit, based on the determination, one of first transmission data and second transmission data to an external memory. The first transmission data includes the first and second compressed parts, and the second transmission data includes the first and second parts of the uncompressed data.

According to at least one example embodiment, if the actual data size of the first compressed part is less than or equal to the expected data size of the first compressed part, the data processing device is configured to compress the second uncompressed part of the uncompressed data, and transmit the first transmission data to the external memory.

According to at least one example embodiment, if the actual data size of the first compressed part is greater than the expected data size of the first compressed part, the data processing device is configured to terminate a compression operation on the second uncompressed part, and transmit the second transmission data to the external memory.

According to at least one example embodiment, the expected data size is based on a desired minimum compression ratio, a compression ratio of a compression algorithm used to compress the first uncompressed part, and a reference data block size.

According to at least one example embodiment, the first and second parts of uncompressed data correspond to first and second data blocks, respectively.

According to at least one example embodiment, the first and second parts of uncompressed data correspond to first and second parts of a single data block, respectively.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF EXAMPLE EMBODIMENTS

Figure 1:
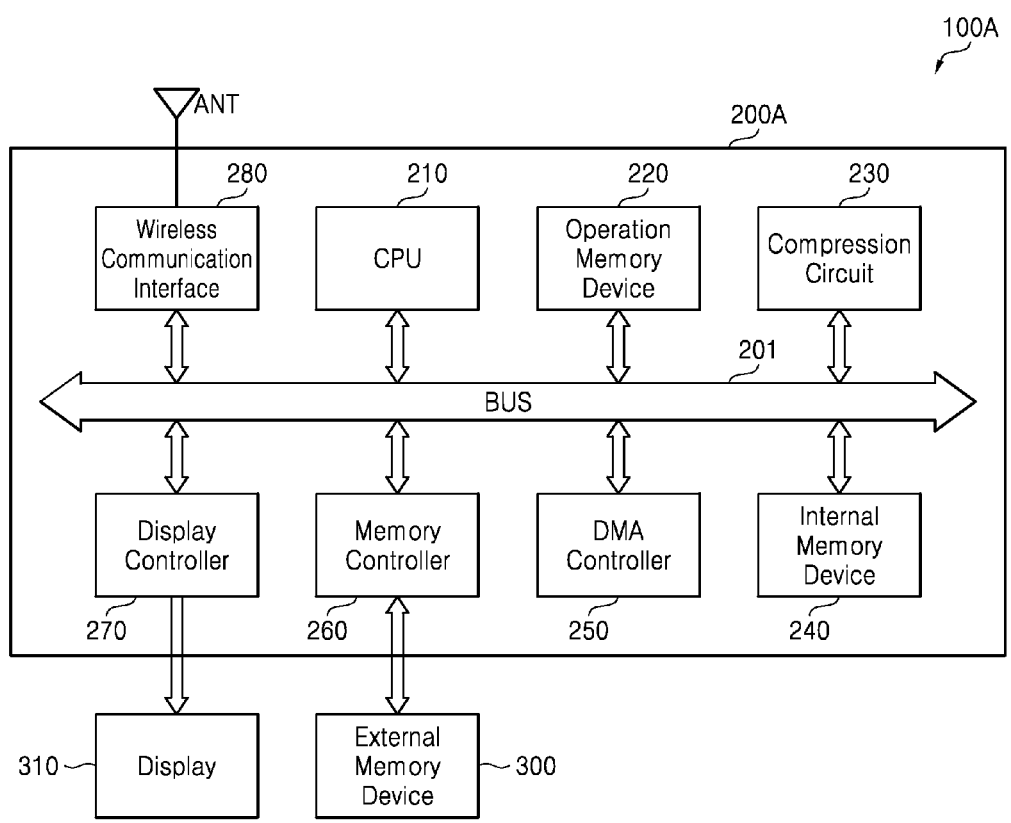
FIG. 1 is a block diagram of a data processing system according to at least one example embodiment of the inventive concepts.

The inventive concepts will be described more fully hereinafter with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A data swap operation or a memory copy operation disclosed hereinafter may be performed using hardware and/or software. The data swap operation or the memory copy operation indicates an operation in which compressed or uncompressed data is transmitted or moved from an internal memory device to an external memory device.

FIG. 1 is a block diagram of a data processing system 100A according to at least one example embodiment of the inventive concepts.

The data processing system 100A may be implemented as a personal computer (PC) or a mobile device.

The mobile device may be a laptop computer, a mobile telephone, a smart phone, a tablet PC, a personal digital assistant (PDA), an enterprise digital assistant (EDA), a portable multimedia player (PMP), a personal navigation device or portable navigation device (PND), a handheld game console, a mobile internet device (MID), an e-book, etc.

The data processing system 100A includes a data processing device 200A, an external memory device 300, and a display 310. The data processing system 100A may also include an antenna ANT for wireless communication.

The data processing device 200A may be implemented in an integrated circuit (IC) or a system on chip (SoC). Alternatively, the data processing device 200A may be implemented as a mobile application processor.

The data processing device 200A may include a central processing unit (CPU) 210, an operation memory device 220, a compression circuit 230, an internal memory device 240, a direct memory access (DMA) controller 250, a memory controller 260, and a display controller 270.

The data processing device 200A may also include a wireless communication interface 280 that performs wireless communication with other mobile devices through the antenna ANT.

The CPU 210 may access the operation memory device 220, the internal memory device 240, and the external memory device 300 through the memory controller 260. The CPU 210 may control the operation of at least one of the operation memory device 220, the compression circuit 230, the internal memory device 240, the DMA controller 250, the memory controller 260, the display controller 270, and the wireless communication interface 280 through a bus 201. The CPU 210 may be implemented by a processor or a multi-core processor.

The operation memory device 220 may be implemented by a non-volatile memory device such as a read-only memory (ROM) and/or a flash memory device or a volatile memory device such as a random access memory (RAM). The operation memory device 220 may store programs and/or data necessary for the operation of the CPU 210.

The compression circuit 230 may calculate (or predict) a compression ratio (or the size of compressed data) for part of data to be swapped or memory copied. The compression circuit 230 may also determine whether to compress the remaining part of the data based on the calculation (or prediction) result.

The internal memory device 240 may store uncompressed data and/or data compressed by the compression circuit 230. The internal memory device 240 may be implemented by a non-volatile memory device such as a flash memory device and/or a volatile memory device such as a dynamic random access memory (DRAM).

The DMA controller 250 may transmit compressed data and/or uncompressed data stored in the internal memory device 240 to the external memory device 300 through the memory controller 260 according to the control of the CPU 210 and/or a determination signal output from the compression circuit 230.

The memory controller 260 may interface command signals and/or data between the data processing device 200A and the external memory device 300 based on the control of the CPU 210 and/or the control of the DMA controller 250.

The display controller 270 may process data to be displayed on the display 310 according to the control of the CPU 210.

The external memory device 300 may be implemented as an embedded memory device or an outer mounted memory device. The external memory device 300 may be implemented by a DRAM, a flash memory device, an embedded multimedia card (eMMC), a universal flash storage (UFS), etc.

Figure 2:
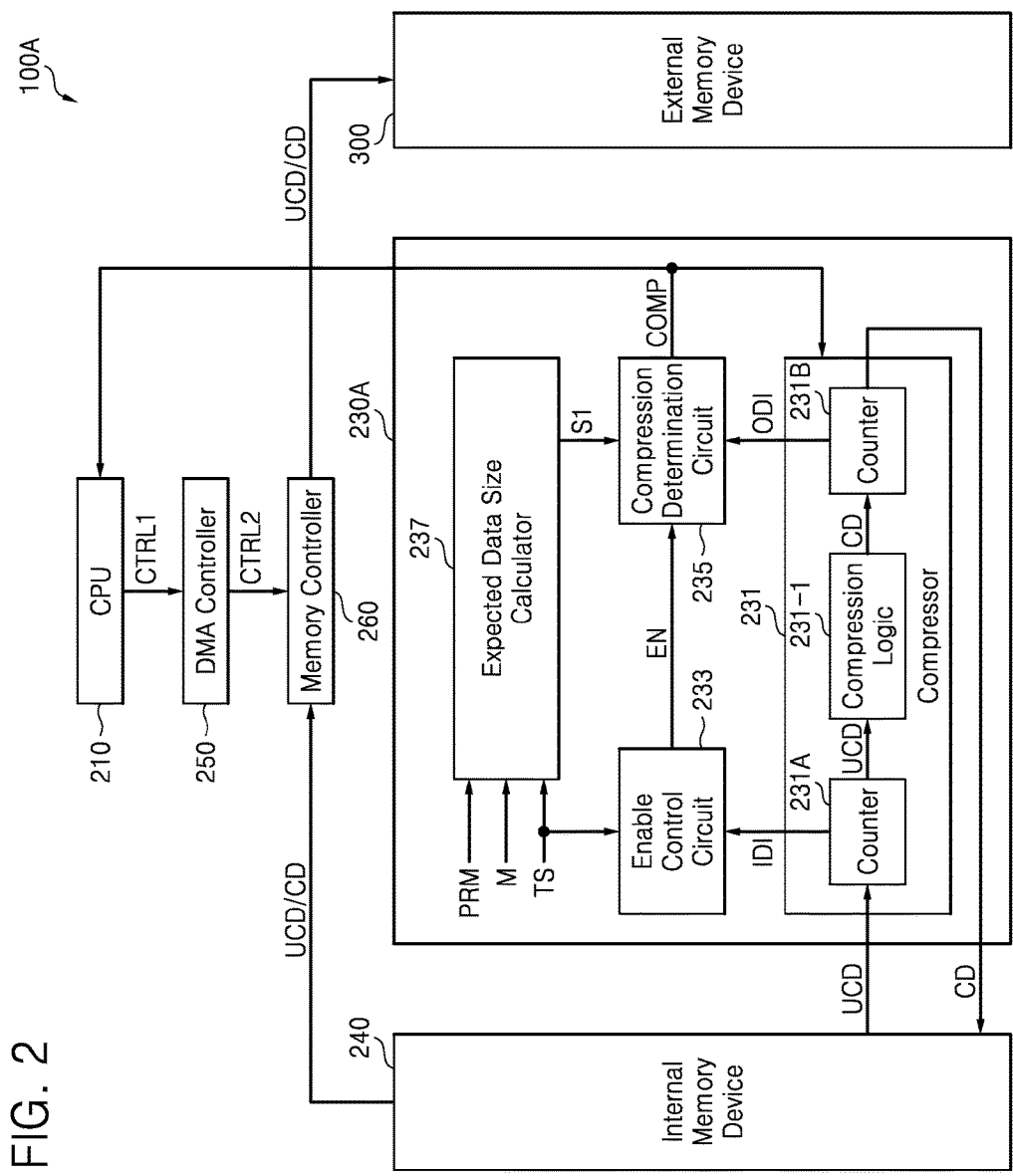
FIG. 2 is a conceptual diagram for explaining an example operation of a data processing system including a compression circuit according at least one example embodiment of the inventive concepts.

FIG. 2 is a conceptual diagram for explaining an example operation of the data processing system 100A including the compression circuit 230 according at least one example embodiment of the inventive concepts.

A compression circuit 230A, i.e., an example of the compression circuit 230 illustrated in FIG. 1 may compress uncompressed data UCD using a single compression algorithm, i.e., a one-step compression method.

The compression circuit 230A predicts (or expects) a compression ratio for part of the uncompressed data UCD and determines whether to perform compression on the remaining part of the uncompressed data UCD or perform a memory copy operation on all of the uncompressed data UCD based on the prediction (or expectation) result.

The compression circuit 230A includes a compressor 231, an enable control circuit 233, a compression determination circuit 235, and an expected data size calculator 237.

The compression circuit 230A may compress the part of the uncompressed data UCD output from the internal memory device 240, determine (e.g., simultaneously determine) whether to compress the remaining part of the uncompressed data UCD, and generate a determination signal COMP based on the determination result.

The uncompressed data UCD may be divided into a plurality of data blocks and the compressor 231 may compress each of the data blocks. A data block size may be determined based on a compression algorithm used in the compressor 231.

For convenience of explanation, it is assumed that a data block size set by a user or a manufacturer (hereinafter, referred to as a "reference data block size TS") is 90 Kbytes, a compression ratio set by the user or the manufacturer (hereinafter, referred to as a "minimum compression ratio M") is 0.4, and a corresponding compressor 231 and/or 232 compress data in units of data blocks.

Figure 3:
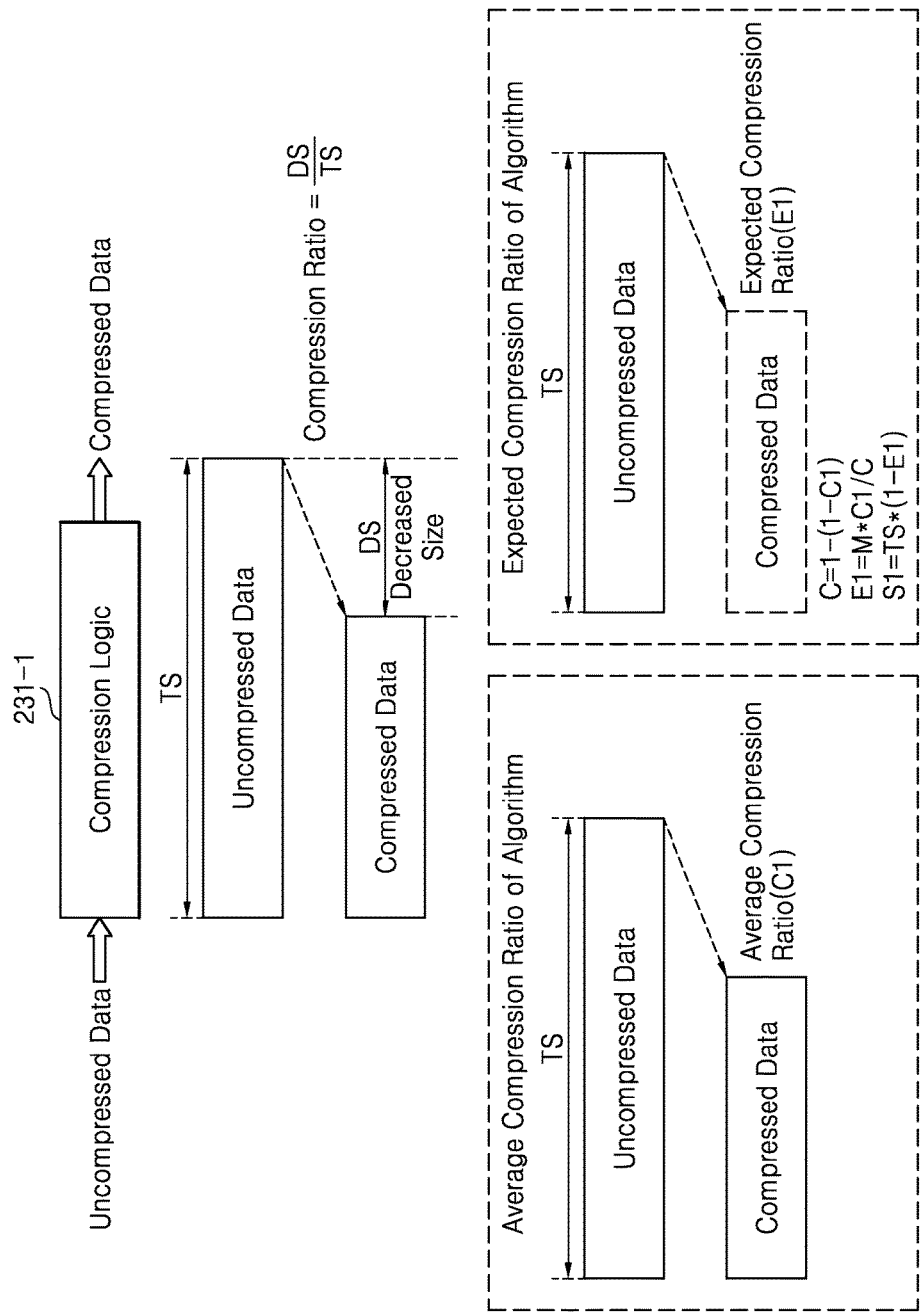
FIG. 3 is a conceptual diagram of an average compression ratio and an expected compression ratio in an example operation of the compression circuit illustrated in FIG. 2.

It is also assumed that an average compression ratio of a compression algorithm (hereinafter, referred to as an "average compression ratio PRM") is an experimental average value and may be set by the user or the manufacturer. It should be understood that a compression ratio is a ratio of a decreased size DS in compression to an uncompressed data size, i.e., the reference data block size TS, as shown in FIG. 3.

The compressor 231 may compress the uncompressed data UCD output from the internal memory device 240 in units of data blocks and transmit compressed data CD to the internal memory device 240.

The compressor 231 may include a first counter 231A, a compression logic 231-1, and a second counter 231B.

The first counter 231A counts the size of a data block to be compressed and outputs an input data index IDI based on the count result. For instance, the first counter 231A may count the size of the data block to be compressed by bytes.

The compression logic 231-1 is a logic circuit that compresses the uncompressed data UCD and generates the compressed data CD.

The second counter 231B counts the size of the compressed data CD output from the compression logic 231-1 and outputs an output data index ODI based on the count result. The output data index ODI may correspond to the actual data size of the compressed data output by compression logic 231-1. For instance, the second counter 231B may count the size of the compressed data CD by bytes. In at least one embodiment, the counters 231A and 231B may count the size of a data block by bits based on a clock signal.

Although the counters 231A and 231B are shown as being implemented within the compressor 231 in the embodiments illustrated in FIG. 2, they may be implemented outside the compressor 231 in at least one other embodiment. For instance, the first counter 231A may be implemented within the enable control circuit 233.

The enable control circuit 233 may generate an enable signal EN for determining a comparison timing of the compression determination circuit 235 and/or an output timing of the determination signal COMP. The enable control circuit 233 may compare the reference data block size TS with the input data index IDI and generate the enable signal EN based on the comparison result.

Figure 4:
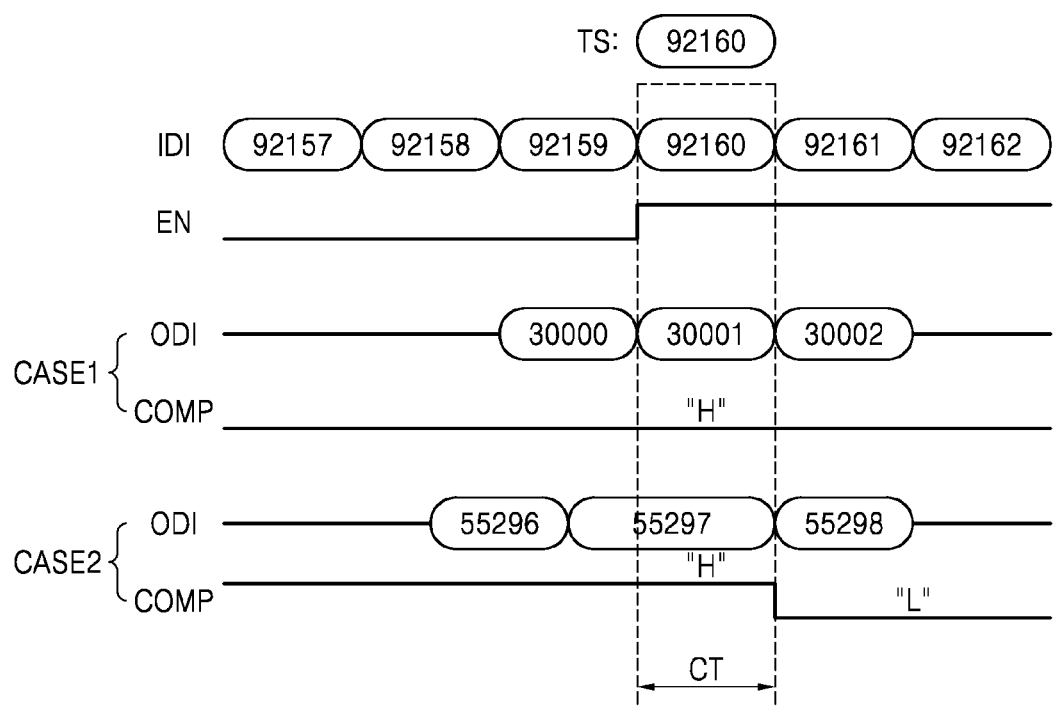
FIG. 4 is a conceptual diagram for explaining example operations of an enable control circuit and a compression determination circuit, which are illustrated in FIG. 2.
Figure 8:
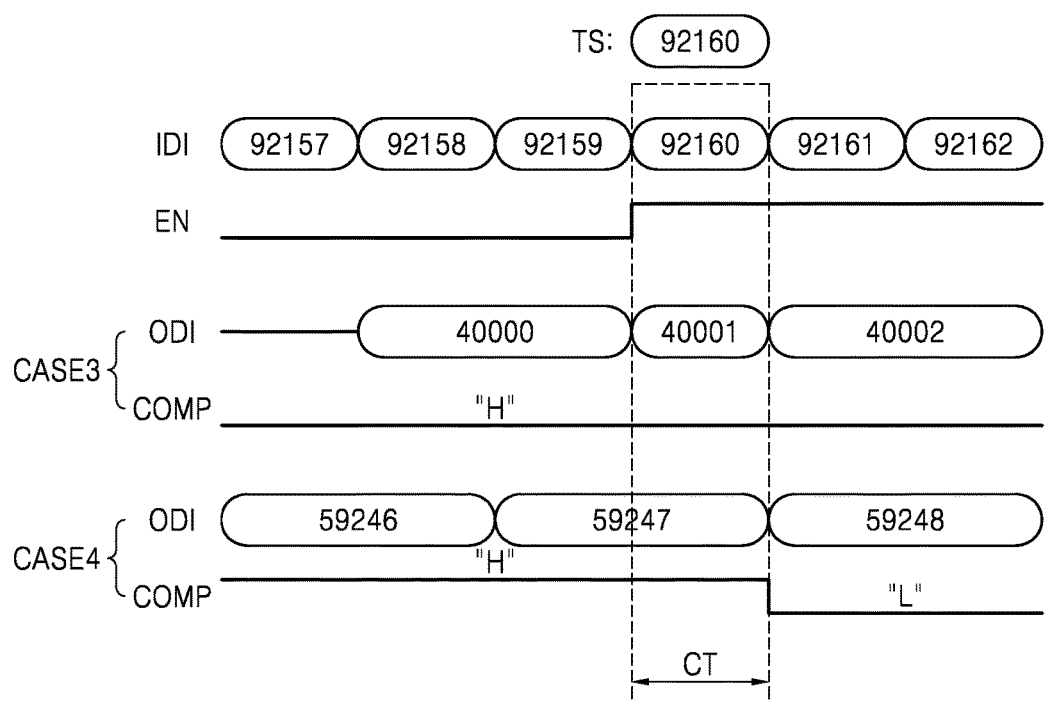
FIG. 8 is a conceptual diagram for explaining example operations of an enable control circuit and a compression determination circuit, which are illustrated in FIG. 6.

The reference data block size TS indicates the size of input data to be compressed, the amount of reference data used to predict a compression ratio, and/or the amount of data necessary to construct a single data block. The reference data block size TS may be programmed by a user or a manufacturer. In other words, the enable control circuit 233 may generate the enable signal EN that is activated when the reference data block size TS, e.g., 92,160, is the same as the input data index IDI, e.g., 92,160, as shown in FIG. 4 or 8.

The compression determination circuit 235 may compare an expected data size S1 with the output data index ODI, i.e., the actual size of data compressed by the compressor 231 in response to the enable signal EN that has been activated and transmit the determination signal COMP, which has a different level according to the comparison result, to the compressor 231 and the CPU 210.

The determination signal COMP may be set to a first level, e.g., a high level, by default. When the determination signal COMP is at the first level, the compressor 231 is enabled, and therefore, the compressor 231 performs compression on the part of the uncompressed data UCD. When the determination signal COMP is at the first level, the CPU 210 may generate a first control signal CTRL for disabling the DMA controller 250.

For convenience of explanation, it is assumed that the part of the uncompressed data UCD is a first data block among a plurality of data blocks included in the uncompressed data UCD. However, the number of data blocks included in the part of the uncompressed data UCD may vary with design.

The expected data size calculator 237 may calculate the expected data size S1 using the average compression ratio PRM of a compression algorithm used in the compressor 231, the minimum compression ratio M, and the reference data block size TS.

The memory controller 260 may transmit transmission data (i.e., the uncompressed data UCD or the compressed data CD) from the internal memory device 240 to the external memory device 300 based on a second control signal CTRL2 output from the DMA controller 250.

FIG. 3 is a conceptual diagram of an average compression ratio and an expected compression ratio in the operation of the compression circuit 230A illustrated in FIG. 2.

Referring to FIGS. 2 and 3, a reference character C denotes an overall compression ratio of the compressor 231, a reference character C1 denotes the average compression ratio of a compression algorithm used in the compressor 231, a reference character E1 denotes an expected compression ratio calculated by the expected data size calculator 237, and the reference character S1 denotes the expected data size calculated by the expected data size calculator 237.

The expected data size calculator 237 calculates the expected data size S1 using input parameters PRM, M, and TS and Equation 1:

$$C = 1 - (1 - C1)$$

$$E1 = M * C1 / C$$

$$S1 = TS * (1 - E1), \quad (1)$$

Where PRM is the same as C1. As mentioned above, the input parameters PRM, M, and TS may be set or programmed by a manufacturer or a user.

Figure 5:
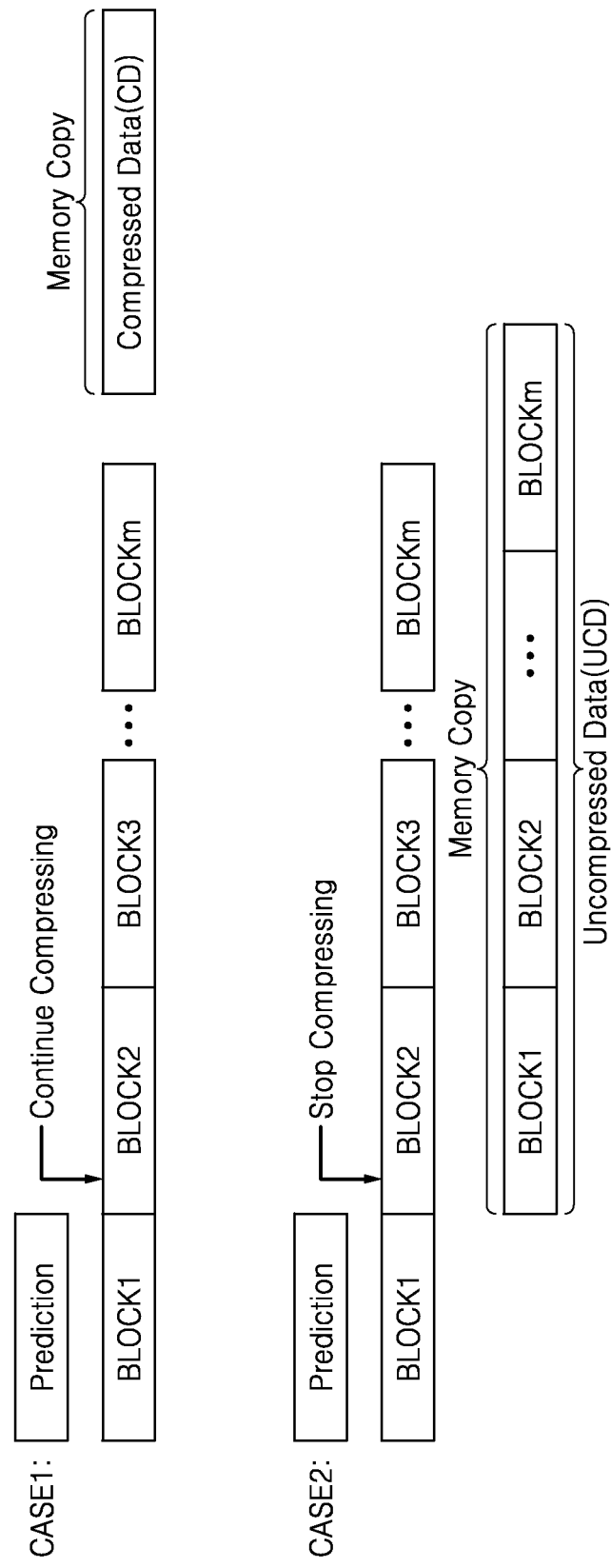
FIG. 5 is a conceptual diagram for explaining an example operation of the compression circuit illustrated in FIG. 2.

FIG. 4 is a conceptual diagram for explaining example operations of the enable control circuit 233 and the compression determination circuit 235, which are illustrated in FIG. 2. FIG. 5 is a conceptual diagram for explaining an example operation of the compression circuit 230A illustrated in FIG. 2.

When the average compression ratio PRM is 0.6, the minimum compression ratio M is 0.4, and the reference data block size TS is 90 Kbytes; the operation of the compression circuit 230A will be described with reference to FIGS. 2 through 5 below.

The expected data size calculator 237 may calculate the expected data size S1 using Equation 1. At this time, the expected data size S1 is 55296.

Since the determination signal COMP is set to the first level, the compressor 231 is enabled to compress the part, e.g., a first data block BLOCK1, of the uncompressed data UCD and the DMA controller 250 is disabled in response to the first control signal CTRL1 output from the CPU 210.

The first counter 231A counts the size of the first data block BLOCK1 by bytes and generates the input data index IDI. The second counter 231B counts the size of data compressed by the compression logic 231-1 by bytes and generates the output data index ODI.

In a comparison interval CT, that is, when the input data index IDI (=92160) is the same as the reference data block size TS (=92160), the enable control circuit 233 outputs the enable signal EN activated. The compression determination circuit 235 compares the output data index ODI with the expected data size S1 in response to the enable signal EN activated and generates the determination signal COMP.

For instance, when the output data index ODI (or actual data size of the compressed data) is the same as or less than the expected data size S1 in the comparison interval CT (CASE1) in FIG. 4, the compression determination circuit 235 generates the determination signal COMP remaining at the first level (e.g., a high level). In response to the determination signal COMP at the first level, the compressor 231 may sequentially compress the remaining data blocks BLOCK2 through BLOCKm (where "m" is a natural number) included in the uncompressed data UCD.

The compressor 231 sequentially compresses the data blocks BLOCK1 through BLOCKm and stores the compressed data CD in the internal memory device 240. When the disabled DMA controller 250 is enabled and outputs the second control signal CTRL2 to the memory controller 260, the memory controller 260 transmits the compressed data CD from the internal memory device 240 to the external memory device 300. In other words, the memory controller 260 performs the data swap operation and/or the data copy operation) using the compressed data CD.

However, when the output data index ODI (or actual data size of the compressed data) is greater than the expected data size S1 in the comparison interval CT (CASE2) in FIG. 4, the compression determination circuit 235 generates the determination signal COMP transitioning from the first level to a second level different than the first level (e.g., a low level).

In response to the determination signal COMP at the second level, e.g., a low level, the compressor 231 is disabled, and therefore, the compressor 231 stops compressing data. At this time, the CPU 210 transmits the first control signal CTRL1 to the DMA controller 250 in response to the determination signal COMP at the second level.

The first control signal CTRL1 includes signals for transmitting the uncompressed data UCD from the internal memory device 240 to the external memory device 300. The signals may include an address indicating a storage region in the internal memory device 240 in which data subjected to data swap and/or memory copy has been stored, an address indicating a storage region in the external memory device 300 in which the data will be stored, and a signal indicating the amount of the data.

The DMA controller 250 transmits the second control signal CTRL2 to the memory controller 260 in response to the first control signal CTRL1. Therefore, the memory controller 260 transmits the uncompressed data UCD from the internal memory device 240 to the external memory device 300 in response to the second control signal CTRL2. In other words, the memory controller 260 performs the data swap operation and/or the data copy operation using the uncompressed data UCD. At this time, compressed data corresponding to the first data block BLOCK1 may be discarded from the internal memory device 240.

Figure 6:
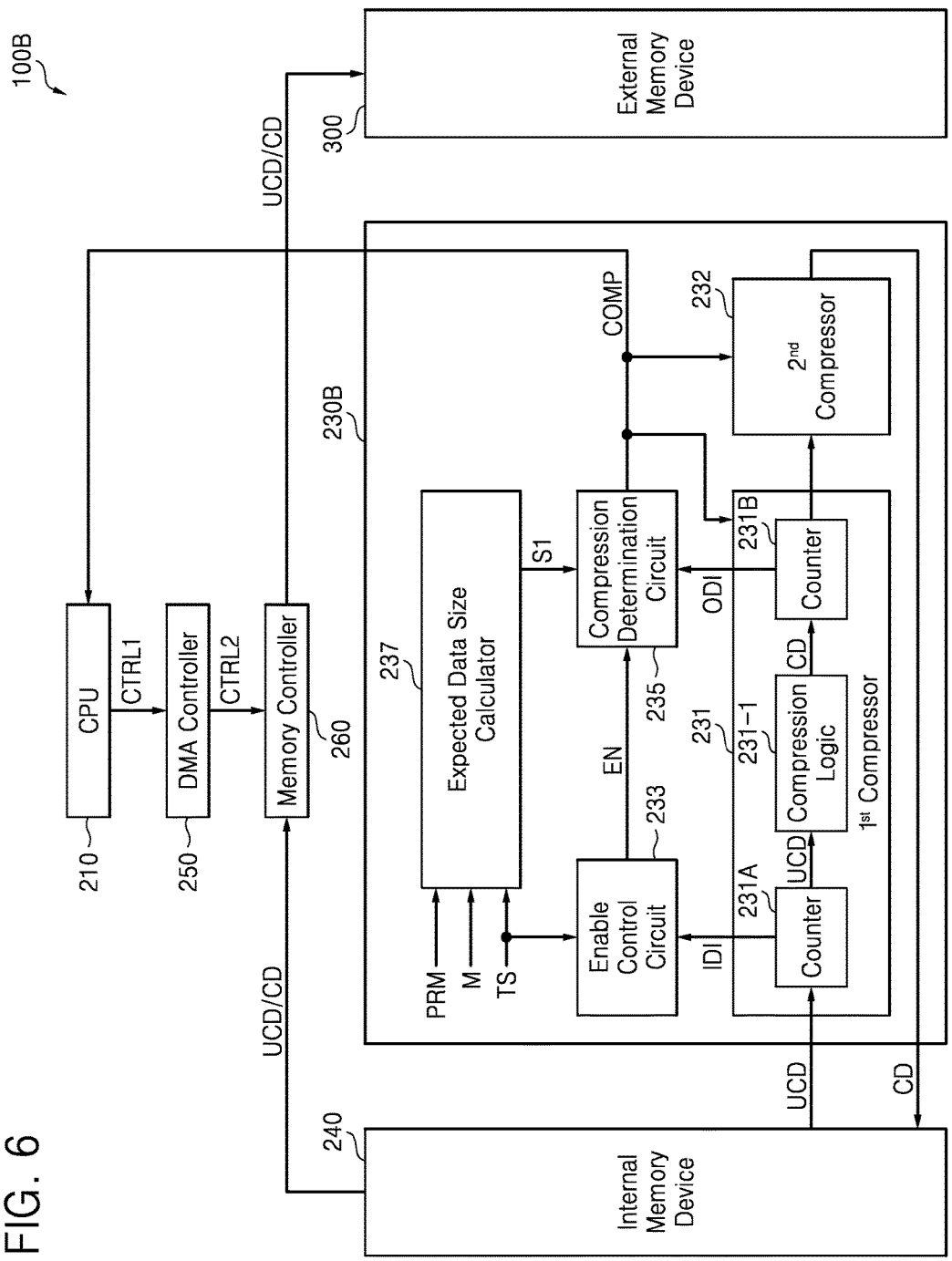
FIG. 6 is a conceptual diagram for explaining an example operation of a data processing system including a compression circuit according at least one example embodiment of the inventive concepts.

FIG. 6 is a conceptual diagram for explaining an example operation of a data processing system 100B including a compression circuit 230B according to at least one example embodiment of the inventive concepts. The compression circuit 230B may compress the uncompressed data UCD using a plurality of compression algorithms, i.e., a multi-step compression method.

The structure and the operation of the data processing system 100B illustrated in FIG. 6 is substantially the same as those of the data processing system 100A illustrated in FIG. 1, with the exception that the compression circuit 230B includes a plurality of compressors 231 and 232 connected in series to each other. The compressor 231 may use a different compression algorithm than compressor 232. For example, the compression circuit 230B may be a compressor using a DEFLATE algorithm.

Although two compressors 231 and 232 are illustrated in FIG. 6, the compression circuit 230B may include three or more compressors connected in series to each other.

Figure 7:
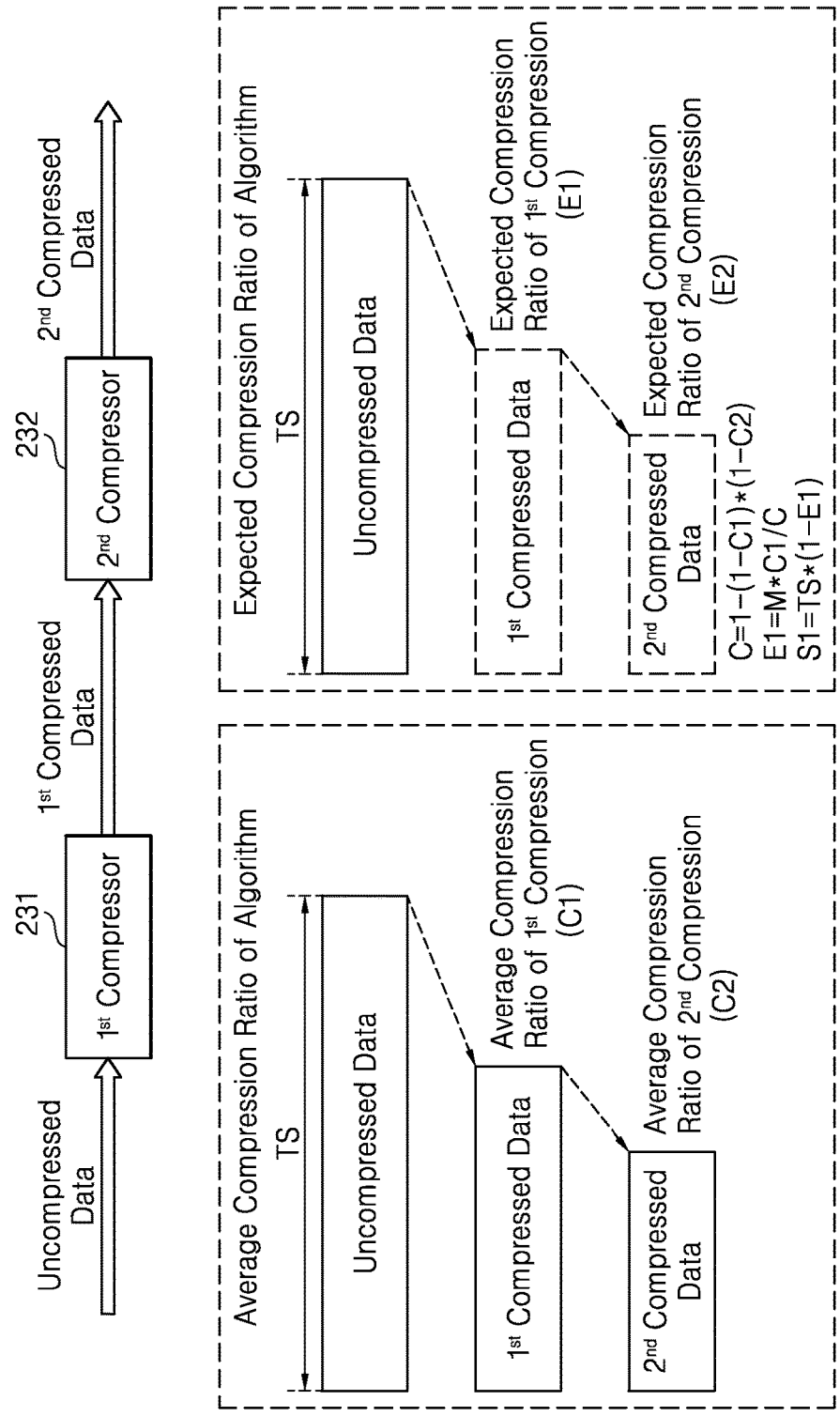
FIG. 7 is a conceptual diagram of an average compression ratio and an expected compression ratio in an example operation of the compression circuit illustrated in FIG. 6.

FIG. 7 is a conceptual diagram of an average compression ratio and an expected compression ratio in the operation of the compression circuit 230B illustrated in FIG. 6.

Referring to FIGS. 6 and 7, reference character C denotes an overall compression ratio of the compression circuit 230B including the compressors 231 and 232, reference character C1 denotes the first average compression ratio of a compression algorithm used in the first compressor 231, reference character C2 denotes the second average compression ratio of a compression algorithm used in the second compressor 232, reference character E1 denotes an expected compression ratio of the first compressor 231 calculated by the expected data size calculator 237, reference character E2 denotes an expected compression ratio of the second compressor 232 calculated by the expected data size calculator 237, and reference character S1 denotes the expected data size calculated by the expected data size calculator 237.

The expected data size calculator 237 calculates the expected data size S1 using the input parameters PRM, M, and TS and Equation 2:

$$C=1-(1-C1)*(1-C2)$$

$$E1=M*C1/C$$

$$E2=M*C2/C$$

$$S1=TS*(1-E1), \quad (2)$$

In this case, the average compression ratio PRM includes the first average compression ratio C1 and the second average compression ratio C2. When the compression circuit 230B includes at least three compressors connected in series to each other, the average compression ratio PRM may include average compression ratios of the three respective compressors.

Figure 9:
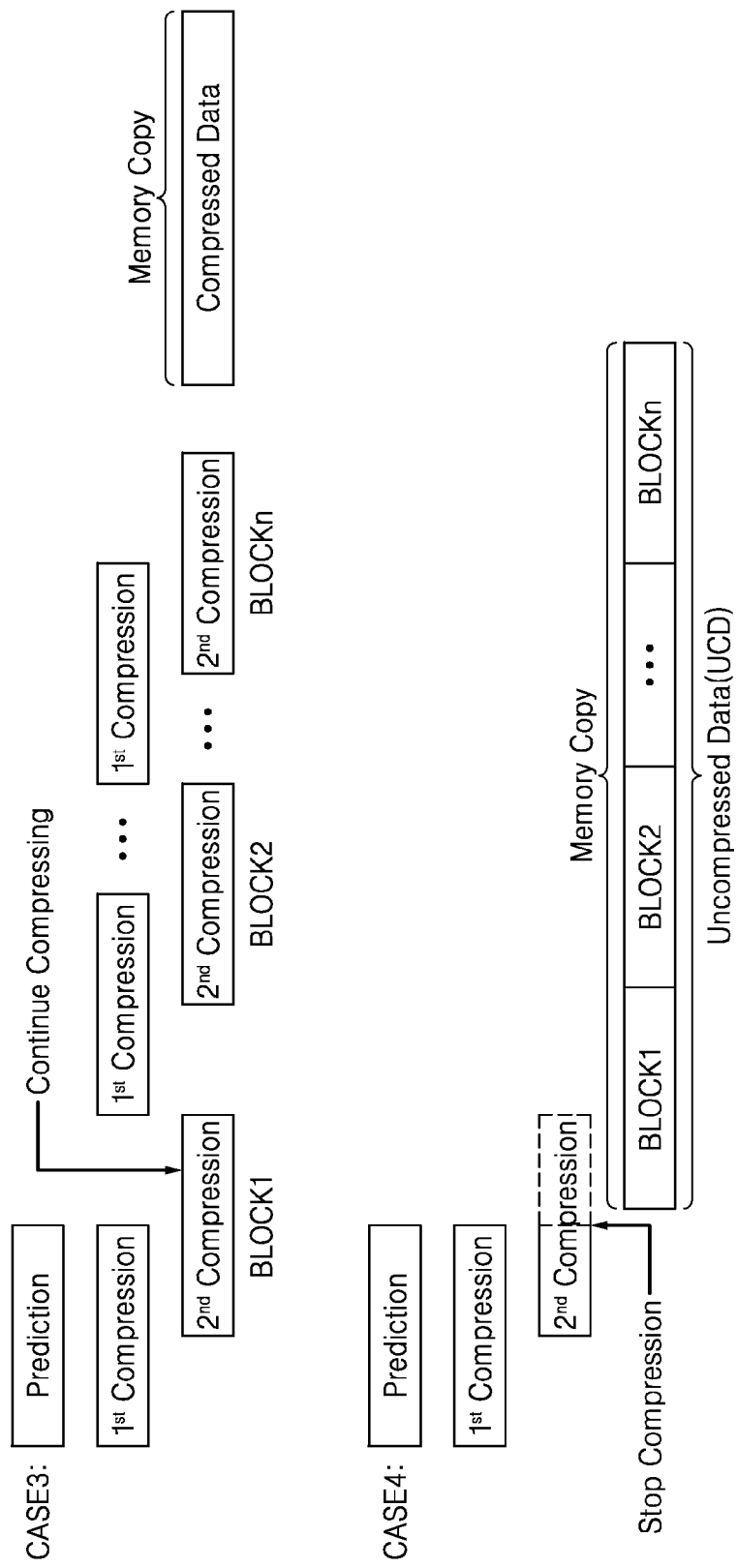
FIG. 9 is a conceptual diagram for explaining an example operation of the compression circuit illustrated in FIG. 6.

FIG. 8 is a conceptual diagram for explaining example operations of the enable control circuit 233 and the compression determination circuit 235, which are illustrated in FIG. 6. FIG. 9 is a conceptual diagram for explaining an example operation of the compression circuit 230B illustrated in FIG. 6.

For convenience of explanation, it is assumed that the first compressor 231 uses an LZ77 algorithm, the first average compression ratio C1 of the first compressor 231 is 0.6, the second compressor 232 uses a Huffman coding algorithm, the second average compression ratio C2 of the second compressor 232 is 0.18, the minimum compression ratio M is 0.4, the reference data block size TS is 90 Kbytes, and the size of each of data blocks BLOCK1 through BLOCKn (where "n" is a natural number) is 90 Kbytes. The expected data size calculator 237 calculates the following values using Equation 2:

$$C=0.672;$$

$$E1=0.357142857; \text{ and}$$

$$S1=92160*(1-0.357142857)=59245.71429 \approx 59246.$$

Since the determination signal COMP is set to the first level, the first compressor 231 is enabled to compress the first data block BLOCK1 and the DMA controller 250 is disabled in response to the first control signal CTRL1 output from the CPU 210.

The first counter 231A of the first compressor 231 counts the size of the first data block BLOCK1 of the uncompressed data UCD by bytes and generates the input data index IDI. The second counter 231B of the first compressor 231 counts the size of the compressed data CD output from the compression logic 231-1 by bytes and generates the output data index ODI.

When the input data index IDI (=92160) is the same as the reference data block size TS (=92160), the enable control circuit 233 outputs the enable signal EN activated in the comparison interval CT in FIG. 8.

The compression determination circuit 235 compares the output data index ODI with the expected data size S1 in response to the enable signal EN activated and generates the determination signal COMP.

For instance, the output data index ODI (=40001)(or actual data size of the compressed data) is the same as or less than the expected data size S1 (=59246) in the comparison interval CT (CASE3 in FIG. 8), and therefore, the compression determination circuit 235 generates the determination signal COMP remaining at the first level (e.g., a high level).

In response to the determination signal COMP at the first level, the compressors 231 and 232 may sequentially compress the data blocks BLOCK1 through BLOCKn included in the uncompressed data UCD using the multi-step compression method (CASE3 in FIG. 9).

After the compressed data CD output from the second compressor 232 is stored in the internal memory device 240, the DMA controller 250 is enabled by the CPU 210. In response to the second control signal CTRL2, the memory controller 260 transmits the compressed data CD from the internal memory device 240 to the external memory device 300.

However, when the output data index ODI (=59247)(or actual data size of the compressed data) is greater than the expected data size S1 (=59246) in the comparison interval CT (CASE4) in FIG. 8, the compression determination circuit 235 generates the determination signal COMP transiting from the first level to the second level.

In response to the determination signal COMP at the second level, e.g., the low level, the compressors 231 and 232 are disabled. Therefore, the compressors 231 and 232 stop compressing data. At this time, the CPU 210 transmits the first control signal CTRL1 to the DMA controller 250 in response to the determination signal COMP at the second level. The first control signal CTRL1 includes signals for transmitting the uncompressed data UCD from the internal memory device 240 to the external memory device 300.

The DMA controller 250 transmits the second control signal CTRL2 to the memory controller 260 in response to the first control signal CTRL1. Therefore, the memory controller 260 may memory copy the uncompressed data UCD from the internal memory device 240 to the external memory device 300 in response to the second control signal CTRL2.

As shown in FIG. 9, first compression is performed by the first compressor 231 and second compression is performed by the second compressor 232. The prediction is performed when the first compression is performed on the first data block BLOCK1. In detail, the prediction is performed at the moment when the first compression on the first data block BLOCK1 is finished.

The data processing device 200A performs only first compression on part, e.g., the first data block BLOCK1, of the uncompressed data UCD and then, when the size of data compressed by the first compressor 231, i.e., the output data index ODI (or actual data size of the compressed data) is greater than the expected data size S1, the data processing device 200A stops further compression for other data blocks and may transmit all of the uncompressed data UCD to the external memory device 300 through data swap and/or memory copy.

Accordingly, in an early stage in which the data swap or the data copy is performed, the data processing device 200A determines whether to compress the uncompressed data UCD, thereby reliably performing the data swap and/or the data copy even when the number of multi-tasking applications increases. As a result, the data processing device 200 increases the reliability of an operating system (OS) in a mobile device.

Figure 10:
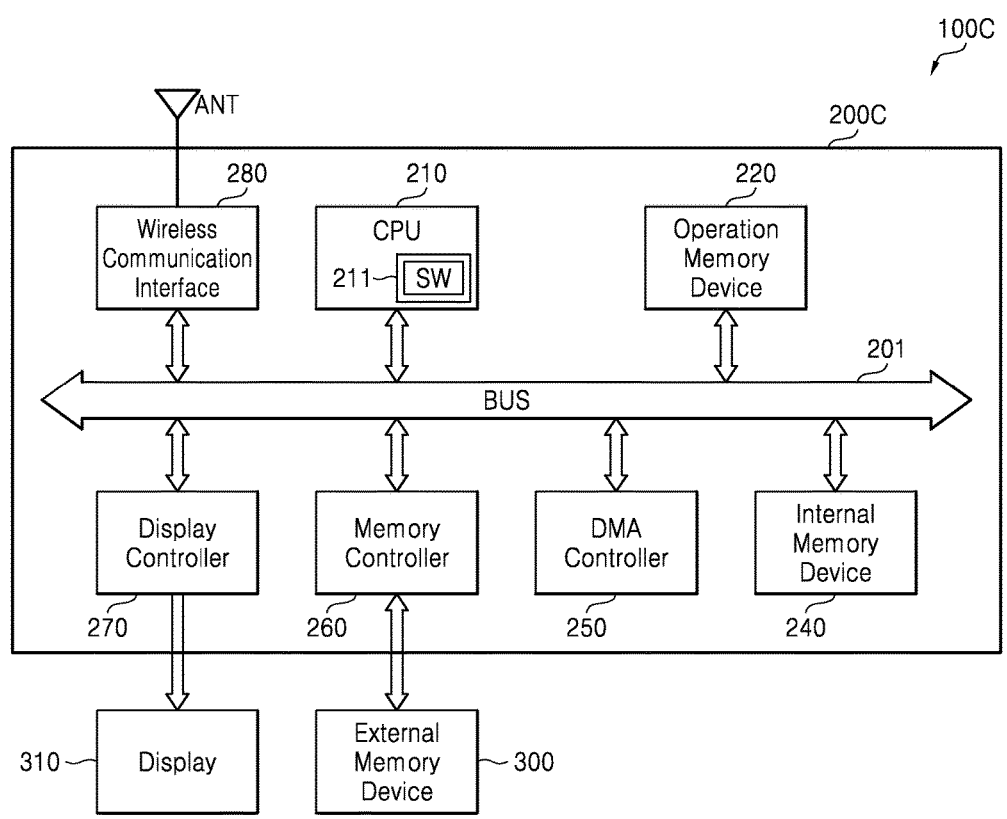
FIG. 10 is a block diagram of a data processing system according to at least one example embodiment of the inventive concepts.
Figure 11:
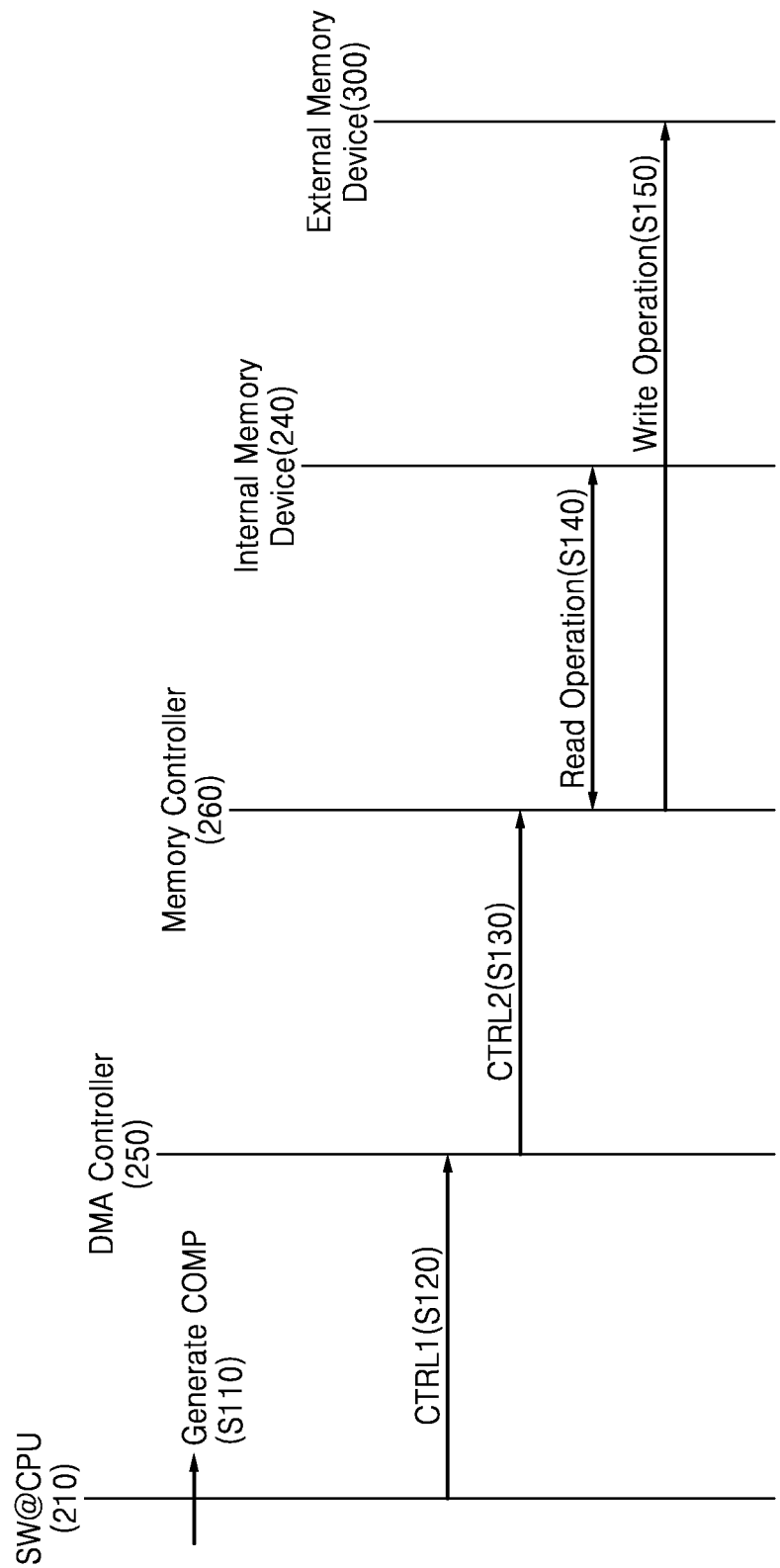
FIG. 11 is a diagram of the flow of signals in an example operation of the data processing system illustrated in FIG. 10.

FIG. 10 is a block diagram of a data processing system 100C according to at least one example embodiment of the inventive concepts. FIG. 11 is a diagram of the flow of signals in the operation of the data processing system 100C illustrated in FIG. 10.

Referring to FIGS. 1 and 10, the data swap operation is performed by a software unit (SW) in the CPU 210 in the data processing system 100C, and therefore, a data processing device 200C does not include a separate compression circuit.

The software unit SW performing the data swap operation according to an example embodiment is loaded from the operation memory device 220 to a memory device 211 included in the CPU 210 and executed by the CPU 210. The software unit SW may be embodied by, for example, a computer processor within CPU 210. The software unit SW may also be embodied as part of the CPU 210. The memory device 211 may be implemented by RAM or static RAM (SRAM). According to at least one example embodiment, the memory device 211 may be implemented outside of the CPU 210.

The function of the compressors 231 and 232, the function of the enable control circuit 233, the function of the compression determination circuit 235, and the function of the expected data size calculator 237 may be implemented in a program code and/or an instruction set.

For example, the CPU 210 may execute a mobile application and the internal memory device 240 may store uncompressed data used in the mobile application. The mobile application may be stored in the operation memory device 220, the internal memory device 240, and/or the external memory device 300.

The software unit SW may calculate a compression ratio for part of the uncompressed data UCD or the expected data size S1 based on the minimum compression ratio M, the average compression ratio PRM of at least one compression algorithm to be used for compression, and the reference data block size TS. In operation S110, the CPU 210 may then generate the determination signal COMP determining whether to compress the remaining part of the uncompressed data UCD based on the calculation result.

According to the determination signal COMP, the remaining part of the uncompressed data UCD may be continuously compressed using the at least one compression algorithm (CASE1 in FIG. 4 and CASE3 in FIG. 9), or further compression for the remaining part of the uncompressed data UCD may be stopped (CASE2 in FIG. 4 and CASE4 in FIG. 9).

In operation S120, the CPU 210 may generate the first control signal CTRL1 for enabling or disabling the DMA controller 250 based on the level of the determination signal COMP.

In operation S130, the DMA controller 250 may transmit the second control signal CTRL2 for controlling the data swap of the compressed data CD or the data swap of the uncompressed data UCD to the memory controller 260 based on the first control signal CTRL1 received from the CPU 210.

In operation S140, the memory controller 260 may perform a read operation on the internal memory device 240 in response to the second control signal CTRL2. In operation S150, the memory controller 260 may write the data CD and/or UCD that has been read to the external memory device 300.

For instance, when the determination signal COMP is at the first level, the memory controller 260 may read the compressed data CD from the internal memory device 240 in response to the second control signal CTRL2 (operation S140), and write the compressed data CD to the external memory device 300 (operation S150).

However, when the determination signal COMP is at the second level, the memory controller 260 may read the uncompressed data UCD from the internal memory device 240 in response to the second control signal CTRL2 (operation S140), and write the uncompressed data UCD to the external memory device 300 (operation S150).

Figure 12:
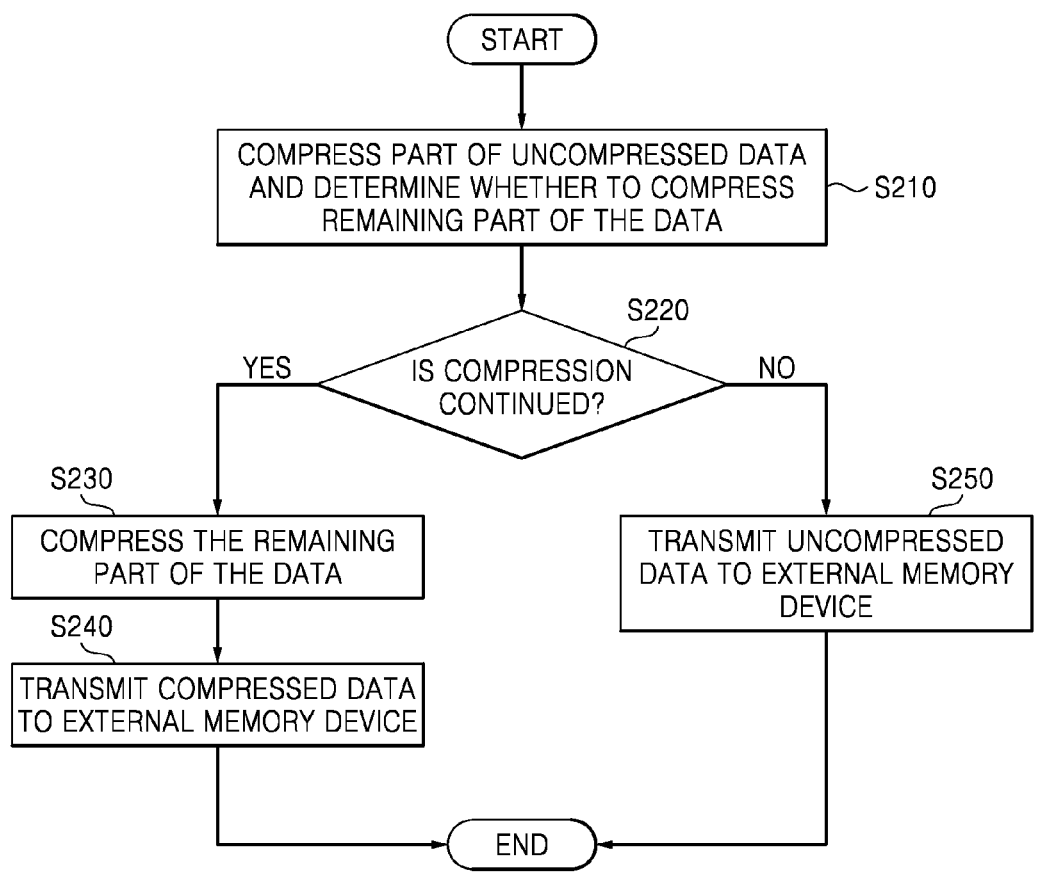
FIG. 12 is an example flowchart of a method of operating a data processing system according to at least one example embodiment of the inventive concepts.

FIG. 12 is a flowchart of a method of operating a data processing system according to at least one example embodiment of the inventive concepts. The operations of the data processing device 200A or 200C will be described with reference to FIGS. 1 through 12.

In operation S210, the data processing device 200A or 200C compresses part of the uncompressed data UCD and determines whether to continue compressing the remaining part of the uncompressed data UCD.

In operation S220, the data processing device 200A or 200C determines whether the compression should be continued based on the determination result. In operation S230, if the data processing device 200A or 200C determines that compression should be continued, then the data processing device 200A or 200C compresses the remaining part of the uncompressed data UCD using at least one compression algorithm. In operation S240, the data processing device 200A or 200C stores the compressed data CD in the internal memory device 240, and transmits the compressed data CD from the internal memory device 240 to the external memory device 300 using the memory copy operation.

However, if the data processing device 200A or 200C determines that compression should not be continued based on the determination result, the data processing device 200A or 200C stops further compression for the remaining part of the uncompressed data UCD. In operation S250, the data processing device 200A or 200C discards compressed data, and transmits all of the uncompressed data UCD, which has been stored in the internal memory device 240 as a target of the memory copy, to the external memory device 300.

As described above, according to at least one example embodiment of the inventive concepts, part of uncompressed data is compressed, whether to compress the remaining part of the uncompressed data is determined, and all of the uncompressed data is transmitted to an external memory device based on the determination result in a data swap operation performed by a data processing system, so that the data swap operation is reliably performed even when the number of multi-tasking applications increases. As a result, the reliability of a mobile OS is increased.

While the inventive concepts have been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. A method of operating a data processing system, the method comprising:
    compressing a first part of uncompressed data using a first compression algorithm from among at least one compression algorithm;
    calculating an expected compression ratio of the first part based on a minimum compression ratio and a ratio of a compression ratio of the first compression algorithm to an overall compression ratio of the at least one compression algorithm;
    calculating an expected data size of the compressed first part based on the expected compression ratio and a reference data block size;
    determining to compress a second part of the uncompressed data when an actual data size of the compressed first part is equal to or less than the expected data size; and
    transmitting one of first transmission data and second transmission data to an external memory device based on a result of the determining, the first transmission data including the compressed first and second parts, the second transmission data including the first and second parts of the uncompressed data.

2. The method of claim 1, wherein the minimum compression ratio and the reference data block size are set by one of a manufacturer and a user.

3. The method of claim 1, wherein the minimum compression ratio is a ratio of a minimum desired data size of the compressed first part to a data size of the first part of the uncompressed data.

4. The method of claim 1, wherein the determining includes:
    generating a count value by counting a data size of the first part of the uncompressed data; and
    comparing the expected data size with the actual data size if the reference data block size is equal to the count value.

5. The method of claim 1, wherein the first part of the uncompressed data includes a first data block from among a plurality of data blocks that are included in the uncompressed data.

6. A data processing system comprising:
    an internal memory device configured to store uncompressed data; and
    a processor configured to,
        compress a first part of the uncompressed data using a first compression algorithm from among at least one compression algorithm,
        calculate an expected compression ratio of the first part based on a minimum compression ratio and a ratio of a compression ratio of the first compression algorithm to an overall compression ratio of the at least one compression algorithm,
        calculate an expected data size of the compressed first part based on the expected compression ratio and a reference data block size,
        determining to compress a second part of the uncompressed data when an actual data size of the compressed first part is equal to or less than the expected data size; and
        control a direct memory access (DMA) controller to transmit one of first transmission data and second transmission data from the internal memory device to an external memory device based on a result of the determination, the first transmission data including the compressed first and second parts, the second transmission data including the first and second parts of the uncompressed data.

7. The data processing system of claim 6, wherein the processor is configured to,
    generate a count value by counting a data size of the first part of the uncompressed data, and
    compare the expected data size with the actual data size if the reference data block size is equal to the count value.

8. A data processing system comprising:
    an internal memory device configured to store uncompressed data;
    a compression circuit configured to,
        compress a first part of the uncompressed data using a first compression algorithm from among at least one compression algorithm,
        calculate an expected compression ratio of the first part based on a minimum compression ratio and a ratio of a compression ratio of the first compression algorithm to an overall compression ratio of the at least one compression algorithm,
        calculate an expected data size of the compressed first part based on the expected compression ratio and a reference data block size,
        determine to compress a second part of the uncompressed data when an actual data size of the compressed first part is equal to or less than the expected data size; and
        output a determination signal based on the determination;
    a central processing unit configured to generate a control signal based on the determination signal; and
    a direct memory access (DMA) controller configured to transmit one of first transmission data and second transmission data from the internal memory device to an external memory device based on the control signal, the first transmission data including the compressed first and second parts, the second transmission data including the first and second parts of the uncompressed data.

9. The data processing system of claim 8, wherein the compression circuit is configured to,
generate a count value by counting a data size of the first part of the uncompressed data,
compare the expected data size with the actual data size if the reference data block size is equal to the count value, and
generate the determination signal based on a result of the comparison.

10. The data processing system of claim 8, wherein the compression circuit comprises:
a compressor configured to compress the first part of the uncompressed data;
an expected data size calculator configured to calculate the expected data size; and
a compression determination circuit configured to,
first compare the expected data size with the actual data size of the compressed first part output from the compressor, and
output the determination signal based on a result of the first comparison.

11. The data processing system of claim 10, wherein,
the compression circuit further includes an enable control circuit configured to,
calculate a size of the first part of the uncompressed data, and
generate an enable signal if the calculated size of the first part is equal to the reference data block size, and
the compression determination circuit is configured to,
second compare the expected data size with the actual data size of the compressed first part in response to the enable signal, and
output the determination signal based on the result of the second comparison.

12. The data processing system of claim 10, wherein the compressor is a first compressor from among a plurality of compressors connected in series to each other.

13. The data processing system of claim 8, wherein the data processing system is a system on chip.

14. The data processing system of claim 8, wherein the compression circuit comprises:
a compressor configured to compress the first part of the uncompressed data;
a first counter configured to count a data size of the first part of the uncompressed data and output a first count value;
a second counter configured to count a data size of the compressed first part output from the compressor and output a second count value;
an expected data size calculator configured to calculate the expected data size; and
a compression determination circuit configured to,
third compare the expected data size with the second count value, and
output the determination signal based on a result of the third comparison.

15. The data processing system of claim 14, wherein,
the compression circuit further includes an enable control circuit configured to generate an enable signal if the reference data block size is equal to the first count value, and
the compression determination circuit is configured to,
fourth compare the expected data size with the second count value in response to the enable signal, and
output the determination signal based on the result of the fourth comparison.

16. A mobile device comprising:
a central processing unit configured to execute a mobile application;
an internal memory device configured to store uncompressed data used in the mobile application;
a compression circuit configured to,
compress a first part of the uncompressed data using a first compression algorithm from among at least one compression algorithm,
calculate an expected compression ratio of the first part based on a minimum compression ratio and a ratio of a compression ratio of the first compression algorithm to an overall compression ratio of the at least one compression algorithm,
calculate an expected data size of the compressed first part based on the expected compression ratio and a reference data block size, and
determine to compress a second part of the uncompressed data when an actual compressed size of the first part is less than or equal to the expected data size; and
a direct memory access (DMA) controller configured to transmit one of first transmission data and second transmission data from the internal memory device to an external memory device based on a result of the determination, the first transmission data including the compressed first and second parts, the second transmission data including the first and second parts of the uncompressed data.

17. The mobile device of claim 16, wherein the compression circuit is configured to,
generate a count value for the first part of the uncompressed data, and
compare the expected data size with the actual compressed data size if the reference data block size is equal to the count value.

18. The mobile device of claim 16, wherein the compression circuit comprises:
a compressor configured to compress the first part of the uncompressed data;
a first counter configured to count a data size of the first part of the uncompressed data and output a first count value;
a second counter configured to count a data size of the compressed first part output from the compressor and output a second count value;
an expected data size calculator configured to calculate the expected data size; and
a compression determination circuit configured to,
compare the expected data size with the second count value, and
determine whether to compress the second part based on a result of the comparison.

19. The mobile device of claim 18, wherein the compressor is a first compressor from among a plurality of compressors connected in series to each other.

20. A data processing device configured to,
compress a first uncompressed part of uncompressed data to produce first compressed data using a first compression algorithm from among at least one compression algorithm,
calculate an expected compression ratio of the first compressed data based on a minimum compression ratio and a ratio of a compression ratio of the first compression algorithm to an overall compression ratio of the at least one compression algorithm, calculate an expected data size of the first compressed data based on the expected compression ratio and a reference data block size, determine to compress a second uncompressed part of the uncompressed data to produce second compressed data when an actual data size of the first compressed data is equal to or less than the expected data size, and transmit, based on the determination, one of first transmission data and second transmission data to an external memory, the first transmission data including the first and second compressed data, the second transmission data including the first and second uncompressed parts of the uncompressed data.

21. The data processing device of claim 20, wherein, if the actual data size of the first compressed data is equal to or less than the expected data size of the first compressed data, the data processing device is configured to transmit the first transmission data to the external memory.

22. The data processing device of claim 20, wherein, if the actual data size of the first compressed data is greater than the expected data size of the first compressed data, the data processing device is configured to, terminate a compression operation on the second uncompressed part, and transmit the second transmission data to the external memory.

* * * * *